United States Patent
Wang et al.

(10) Patent No.: US 7,968,968 B2
(45) Date of Patent: Jun. 28, 2011

(54) INDUCTOR UTILIZING PAD METAL LAYER

(75) Inventors: Sung-Hsiung Wang, Hsinchu (TW);
Chih-Ping Chao, Hsinchu (TW);
Chia-Yu Su, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/790,526

(22) Filed: May 28, 2010

(65) Prior Publication Data

US 2010/0265025 A1   Oct. 21, 2010

Related U.S. Application Data

(62) Division of application No. 11/592,203, filed on Nov. 3, 2006, now abandoned.

(51) Int. Cl.
*H01L 27/08* (2006.01)
(52) U.S. Cl. .......... 257/531; 257/277; 257/E21.022
(58) Field of Classification Search ........... 257/531, 257/277, E21.022
See application file for complete search history.

(56) References Cited

U.S. PATENT DOCUMENTS

| | | | |
|---|---|---|---|
| 5,969,405 A | 10/1999 | Aeugle | |
| 6,356,183 B1 | 3/2002 | Jou | |
| 6,420,773 B1 * | 7/2002 | Liou | 257/531 |
| 2001/0028098 A1 | 10/2001 | Liou | |
| 2005/0275497 A1 * | 12/2005 | Ramadan et al. | 336/200 |
| 2006/0022287 A1 | 2/2006 | Itoi et al. | |
| 2006/0170072 A1 | 8/2006 | Nakashiba | |

* cited by examiner

*Primary Examiner* — Tan N Tran
(74) *Attorney, Agent, or Firm* — Birch, Stewart, Kolasch & Birch, LLP

(57) ABSTRACT

An inductor utilizing a pad metal layer. The inductor comprises a metal spiral, a metal bridge, and a metal interconnect. The metal bridge is formed with the pad metal layer and a plurality of vias and has one end connected to the metal spiral. The metal interconnect is connected to the other end of the metal bridge. In addition, resistivity of the pad metal layer is lower than that of the metal spiral.

12 Claims, 5 Drawing Sheets

INDUCTOR UTILIZING PAD METAL LAYER

The present application is a divisional of U.S. patent application Ser. No. 11/592,203 filed Nov. 3, 2006, now abandoned the entire contents of which are hereby incorporated by reference herein.

BACKGROUND OF THE INVENTION

1. Field of the Invention

The invention relates to spiral inductors and, in particular, to spiral inductors utilizing a pad metal layer.

2. Description of the Related Art

Spiral inductors are important, performance-limiting components in monolithic radio-frequency (RF) circuits, such as voltage-controlled oscillators (VCOs), low-noise amplifiers (LNAs), and passive-element filters. Quality factor of the inductors, limited by resistive losses in the spiral coil and substrate losses, is expressed as $Q=im(Z)/re(Z)$, wherein Z is impedance of the inductor.

FIG. 1A shows a layout of a conventional spiral inductor. FIG. 1B is a cross section of the spiral inductor 100 in FIG. 1A. As shown, the spiral inductor is formed on a silicon substrate using multilevel interconnects provided in mainstream silicon processes. At least two metal layers are required to form a basic spiral coil 110 and an underpass 120 to return the inner terminal of the spiral coil to the outside. The spiral coil 110 is typically formed with a top metal layer and the underpass 120 with a metal layer lower than the top metal layer. The underpass 120 is connected to the spiral coil such that the inner terminal of the spiral inductor 100 is routed out.

The top metal layer in semiconductor process is typically much thicker than other metal layers and thus the spiral inductor 100 is typically formed with the top metal layer such that quality factor thereof is maximized. Unfortunately, the underpass 120 is typically formed with a thinner metal layer, leading to increased resistance of the spiral inductor 100. As a result, the spiral inductor 100 suffers from resistive loss and quality factor thereof is degraded.

BRIEF SUMMARY OF THE INVENTION

An embodiment of an inductor utilizing a pad metal layer comprises a metal spiral, a metal bridge, and a metal interconnect. The metal bridge is formed with the pad metal layer and a plurality of vias and has one end connected to the metal spiral. The metal interconnect is connected to the other end of the metal bridge. Resistivity of the pad metal layer is lower than that of the metal spiral.

Another embodiment of an inductor utilizing a pad metal layer comprises a metal spiral, a metal bridge, and a metal interconnect. The metal bridge is formed with a first metal layer and a plurality of vias and has one end connected to the metal spiral. The metal interconnect is connected to the other end of the metal bridge. The metal spiral and the metal interconnect are formed with a second metal layer and the pad metal layer disposed on the second metal layer. In addition, the first metal layer is lower than the second metal layer.

The invention provides an inductor utilizing a pad metal layer. Since the pad metal layer is typically thick, quality factor of the inductor utilizing the pad metal layer is improved. In addition, the inductor utilizing the pad metal layer is compatible with standard process such that no process modification is required.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
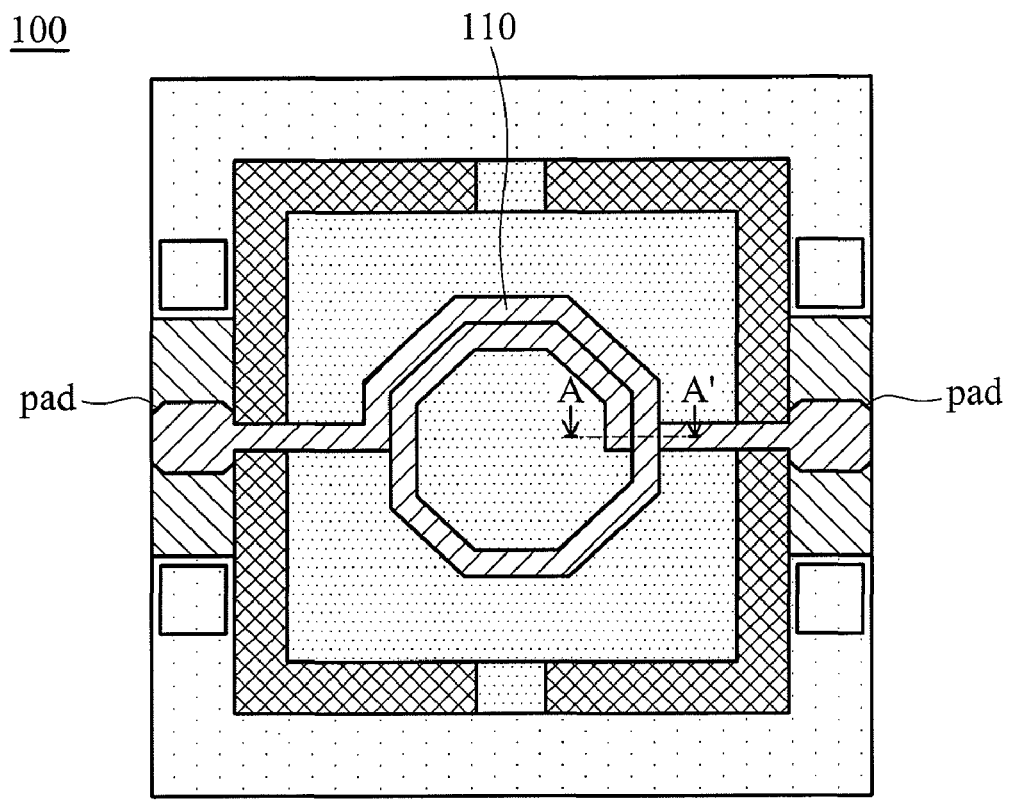
FIG. 1A shows a layout of a conventional spiral inductor.
Figure 1B:
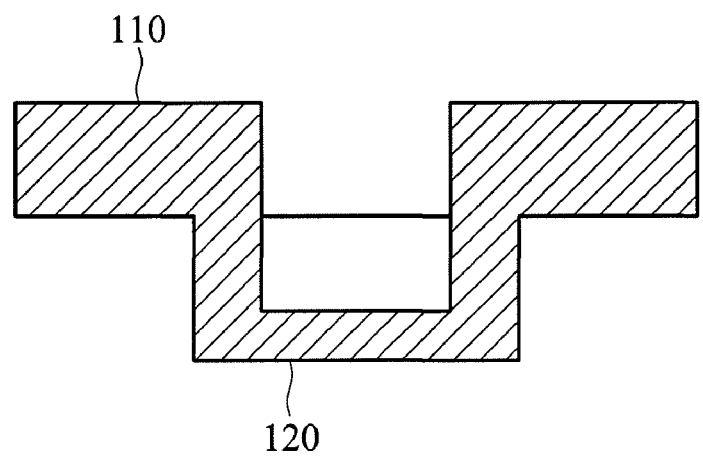
FIG. 1B is a cross section of the spiral inductor in FIG. 1A.
Figure 2A:
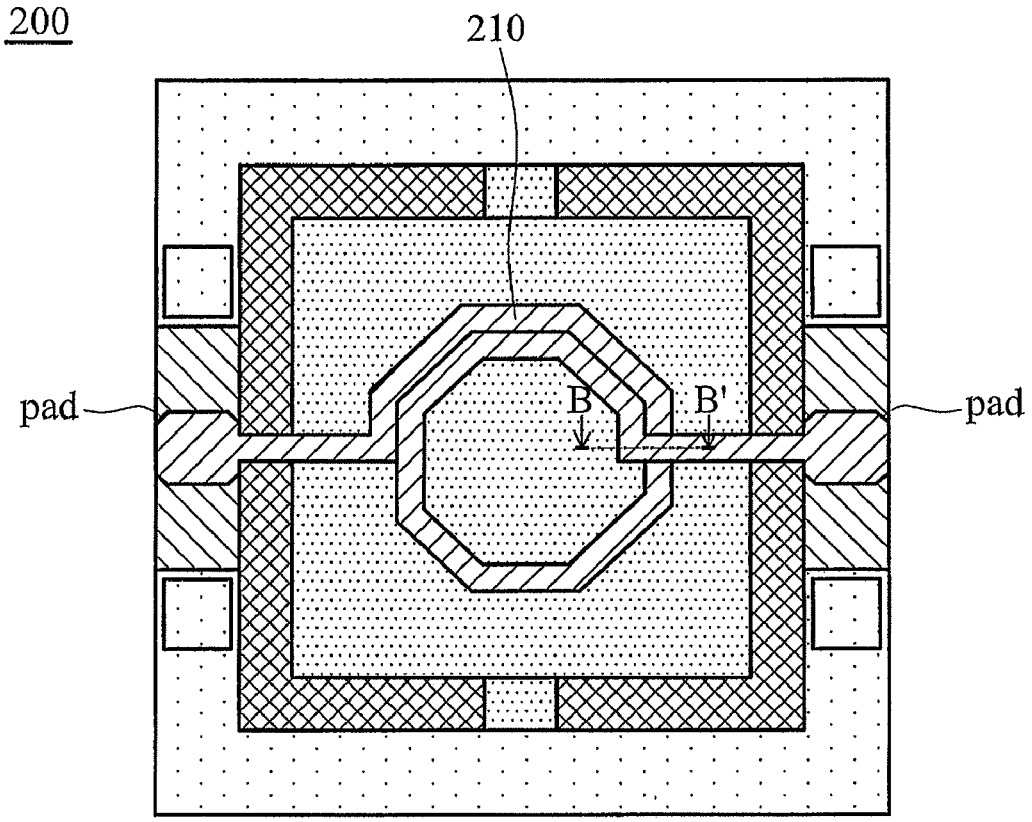
FIG. 2A shows a layout of an inductor utilizing a pad metal layer according to an embodiment of the invention.
Figure 2B:
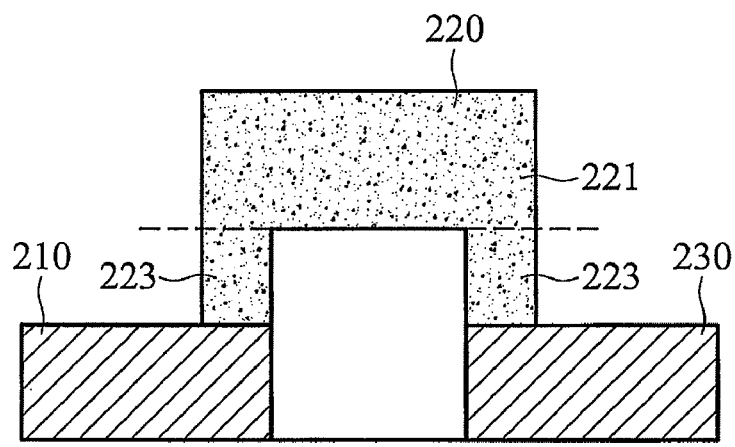
FIG. 2B is a cross section of the inductor utilizing the pad metal in FIG. 2A.

FIG. 2A shows a layout of an inductor utilizing a pad metal layer according to an embodiment of the invention. The inductor 200 comprises a metal spiral 210, a metal bridge 220, and a metal interconnect 230. FIG. 2B is a cross section of the inductor 200 utilizing the pad metal layer in FIG. 2A. As shown in FIGS. 2A and 2B, the metal bridge 220 is formed with the pad metal layer 221 and a plurality of vias 223 and has one end connected to the metal spiral 210. More specifically, the pad metal layer 221 is substantially an aluminum layer. The metal interconnect 230 is connected to the other end of the metal bridge 220. Both the metal spiral 210 and the bridge 220 are typically formed with a top metal layer. More specifically, the top metal layer is substantially copper.

In a 0.13 μm semiconductor process, the top metal layer is typically formed with a copper layer of 9 KÅ and the metal layers under the top metal layer typically with copper layers of about 3 KÅ. The pad metal layer is typically formed with an aluminum layer of 12 KÅ with resistivity thereof equivalent to that of a copper layer of 8 KÅ. In conventional spiral inductors, resistivity of the underpass thereof is much higher than the metal spiral. As a result, the conventional spiral inductor suffers from resistive loss and quality factor thereof is degraded. In the inductor utilizing the pad metal layer according to an embodiment of the invention, the metal bridge has lower resistivity than the underpass. As a result, the inductor utilizing the pad metal layer does not suffer from significant resistive loss and quality factor thereof is higher than that of the conventional spiral inductor. It is noted that the inductor can not only be used in 0.13 μm semiconductor process but also in semiconductor process of other generations. Thus, thickness of the top metal layer and the pad metal respectively ranges from about 1.5 KÅ to 50 KÅ and 5 KÅ to 40 KÅ

Figure 3A:
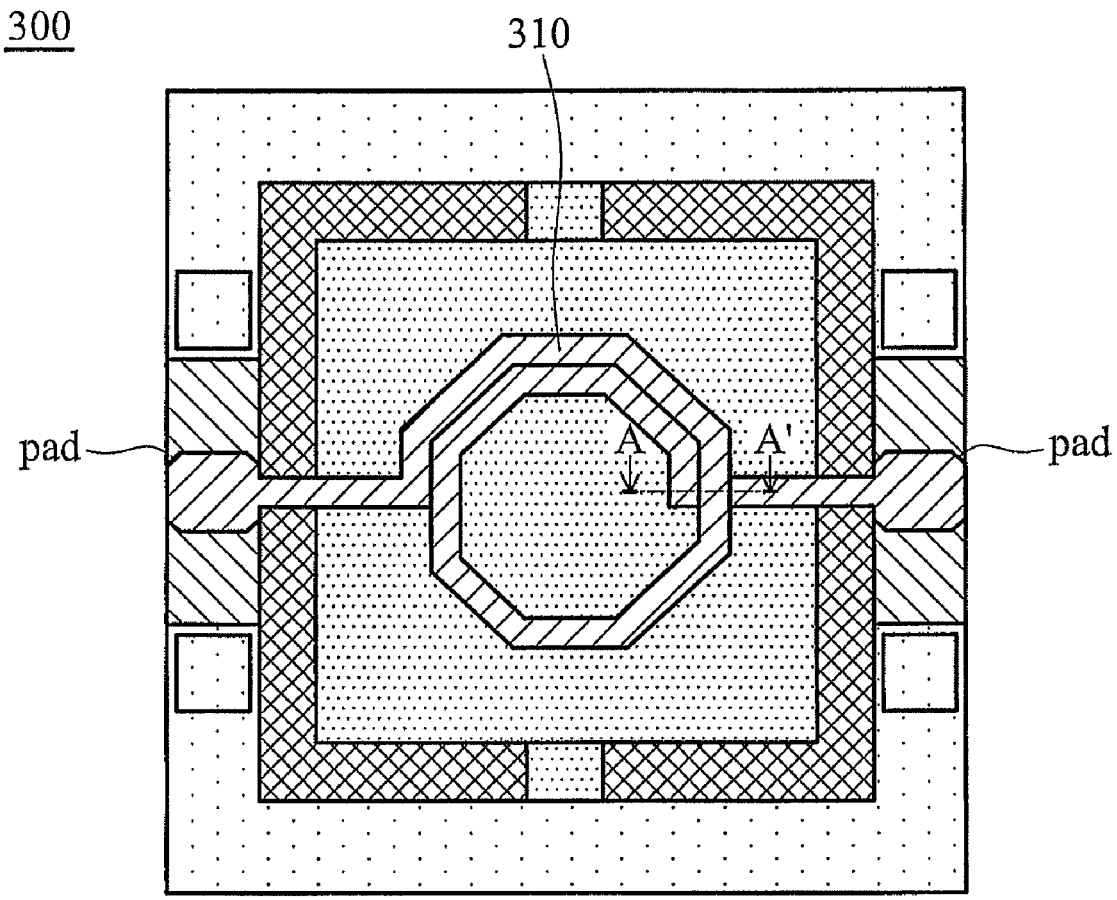
FIG. 3A shows a layout of an inductor utilizing a pad metal layer according to an embodiment of the invention.
Figure 3B:
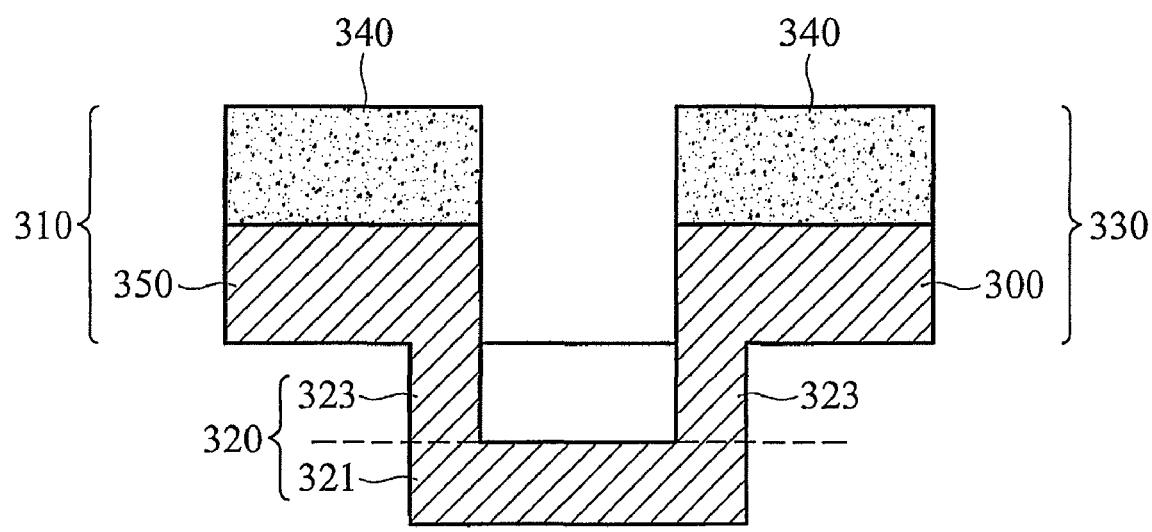
FIG. 3B is a cross section of the inductor 300 utilizing the pad metal layer in FIG. 3A.

FIG. 3A shows a layout of an inductor utilizing a pad metal layer according to an embodiment of the invention. The inductor 300 comprises a metal spiral 310, a metal bridge 320, and a metal interconnect 330. FIG. 3B is a cross section of the inductor 300 utilizing the pad metal layer in FIG. 3A. As shown in FIGS. 3A and 3B, the metal bridge 320 is formed with a first metal layer 321 and a plurality of vias 323 and has one end connected to the metal spiral 310. The metal interconnect 330 is connected to the other end of the metal bridge 320. The metal spiral 310 and the metal interconnect 330 are formed with a second metal layer 350 and the pad metal layer 340 disposed thereon. More specifically, the pad metal layer 340 is substantially an aluminum layer. In addition, the first metal layer 320 is lower than the second metal layer 350. More specifically, the first metal layer 320 and the second metal layer 350 are substantially copper layers.

The metal bridge in the inductor utilizing the pad metal layer is the same as the underpass in a conventional spiral inductor. Resistivity of the metal bridge is higher and results in significant resistive loss of the spiral inductor. However, the metal spiral 310 and the metal interconnect 330 of the inductor utilizing the pad metal layer according to an embodiment of the invention have an additional pad metal layer 340. As a result, low resistance of the metal spiral 310 and the metal interconnect 330 results in less resistive loss and quality factor of the inductor utilizing the pad metal layer is higher than that of the conventional spiral inductor.

Figure 4:
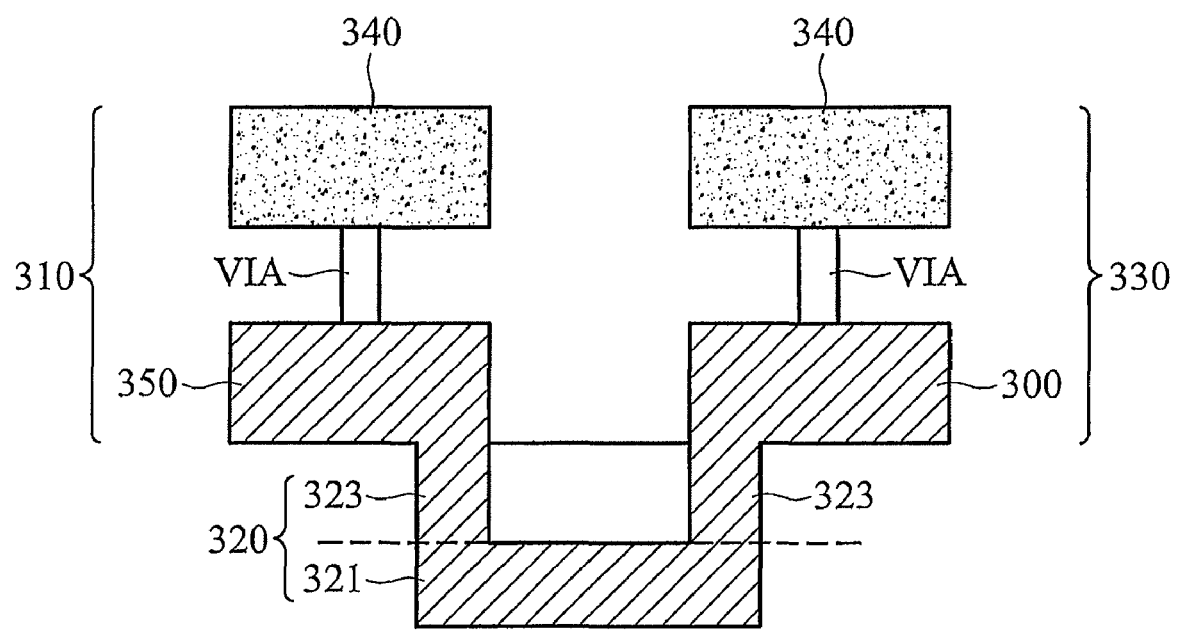
FIG. 4 is a variation of the inductor 300 utilizing the pad metal layer in FIG. 3B.

FIG. 4 is a variation of the inductor 300 utilizing the pad metal layer in FIG. 3B. The inductor utilizing the pad metal layer in FIG. 4 is similar to that in FIG. 3B and only differs in that there are vias VIA coupled between the pad metal layer 340 and the second metal layer 350.

The invention provides an inductor utilizing a pad metal layer. Since the pad metal layer is typically thick, quality factor of the inductor utilizing the pad metal layer is higher. In addition, the inductor utilizing the pad metal layer is compatible with standard process and no process modification is required.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An inductor utilizing a pad metal layer, comprising:
 a metal spiral;
 a metal bridge formed with a first metal layer and a plurality of vias, the metal bridge having one end connected to the metal spiral; and
 a metal interconnect connected to the other end of the metal bridge,
 wherein the metal spiral and the metal interconnect are respectively formed with a second metal layer and the pad metal layer disposed thereon and the first metal layer is lower than the second metal layer.

2. The inductor as claimed in claim 1, wherein the first and second metal layers comprise copper-containing layers and the pad metal layer comprises an aluminum-containing layer.

3. The inductor as claimed in claim 2, wherein thickness of the second metal layer ranges from about 1.5KÅ to about 50KÅ.

4. The inductor as claimed in claim 2, wherein thickness of the pad metal layer ranges from about 5KÅ to about 40KÅ.

5. The inductor as claimed in claim 1, wherein the pad metal layer is in direct contact with the second metal layer.

6. The inductor as claimed in claim 1, wherein the pad metal layer of the metal spiral is separated from that of the metal interconnect.

7. An inductor utilizing a pad metal layer, comprising:
 a metal spiral;
 a metal bridge formed with a first metal layer and a plurality of vias and having one end connected to the metal spiral; and
 a metal interconnect connected to the other end of the metal bridge;
 wherein the metal spiral and the metal interconnect are respectively formed with a second metal layer and the pad metal layer coupled thereto and the first metal layer is lower than the second metal layer.

8. The inductor as claimed in claim 7, wherein the first and second metal layers comprise copper-containing layers and the pad metal layer comprises an aluminum-containing layer.

9. The inductor as claimed in claim 7, wherein thickness of the second metal layer ranges from 1.5KÅ to 50KÅ.

10. The inductor as claimed in claim 7, wherein thickness of the pad metal layer ranges from 5KÅ to 40KÅ.

11. The inductor as claimed in claim 7, wherein the pad metal layer is coupled to the second metal layer by a via.

12. The inductor as claimed in claim 7, wherein the pad metal layer of the metal spiral is separated from that of the metal interconnect.

* * * * *